(12) United States Patent
Kawabata et al.

(10) Patent No.: US 7,042,293 B2
(45) Date of Patent: May 9, 2006

(54) DC/DC CONVERTER USING BIPOLAR TRANSISTOR, METHOD OF MANUFACTURING THE SAME AND DC POWER SUPPLY MODULE USING THE SAME

(75) Inventors: Osamu Kawabata, Tokyo (JP); Koji Nakano, Aichi (JP); Jun Utsumi, Kanagawa (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 10/946,004

(22) Filed: Sep. 22, 2004

(65) Prior Publication Data

US 2005/0035432 A1 Feb. 17, 2005

Related U.S. Application Data

(63) Continuation of application No. PCT/JP2004/009765, filed on Jul. 2, 2004.

(30) Foreign Application Priority Data

Jul. 4, 2003 (JP) ............................. 2003/191551

(51) Int. Cl.
*H03F 3/04* (2006.01)
(52) U.S. Cl. ........................................ 330/297; 330/10
(58) Field of Classification Search ................ 330/297, 330/10, 127; 455/127; 363/21.14, 21.16, 363/21.17, 69, 70, 71, 40, 97; 323/224
See application file for complete search history.

(56) References Cited

U.S. PATENT DOCUMENTS

| | | | | |
|---|---|---|---|---|
| 3,426,290 A | * | 2/1969 | Jensen | .......................... 330/297 |
| 4,054,843 A | * | 10/1977 | Hamada | ...................... 330/263 |
| 4,189,732 A | * | 2/1980 | Atwater | ....................... 342/202 |
| 4,318,164 A | * | 3/1982 | Onodera et al. | ........... 363/21.1 |
| 5,352,912 A | | 10/1994 | Crabbe et al. | |
| 5,789,799 A | | 8/1998 | Voinigescu et al. | |
| 6,423,989 B1 | | 7/2002 | Nakano | |
| 6,660,623 B1 | | 12/2003 | Nakano | |
| 6,777,780 B1 | | 8/2004 | Hueting et al. | |
| 2003/0042480 A1 | | 3/2003 | Hirose | |
| 2003/0090244 A1 | | 5/2003 | Shenai et al. | |

FOREIGN PATENT DOCUMENTS

| | | |
|---|---|---|
| JP | 57-109015 | 7/1982 |
| JP | 7-288976 | 10/1995 |
| JP | 9-182415 | 7/1997 |
| JP | 10-42550 | 2/1998 |
| JP | 10-126174 | 5/1998 |
| JP | 2001-178127 | 6/2001 |
| JP | 2001-223222 | 8/2001 |
| JP | 2001-320880 | 11/2001 |
| JP | 2001-338928 | 12/2001 |
| JP | 2002-299602 | 10/2002 |
| JP | 2003-69008 | 3/2003 |
| JP | 2003-124224 | 4/2003 |
| JP | 2003-151985 | 5/2003 |
| JP | 2003-168688 | 6/2003 |
| WO | 02/101810 | 12/2002 |

OTHER PUBLICATIONS

"Transistor Technology Special—Introduction to Practical Power Electronics—", published by CQ Publishing Company in Aug. 1998, No. 54, p. 112.

* cited by examiner

*Primary Examiner*—Henry Choe
(74) *Attorney, Agent, or Firm*—Wenderoth, Lind & Ponack, L.L.P.

(57) ABSTRACT

A DC/DC converter is comprised of a bipolar transistor, an inductor, a smoothing capacitor, an input terminal, an output terminal, and a grounded terminal. A base of the transistor includes a silicon germanium layer. The bipolar transistor has a high switching speed and a low on-state voltage through an optimization of a structure of the transistor.

9 Claims, 13 Drawing Sheets

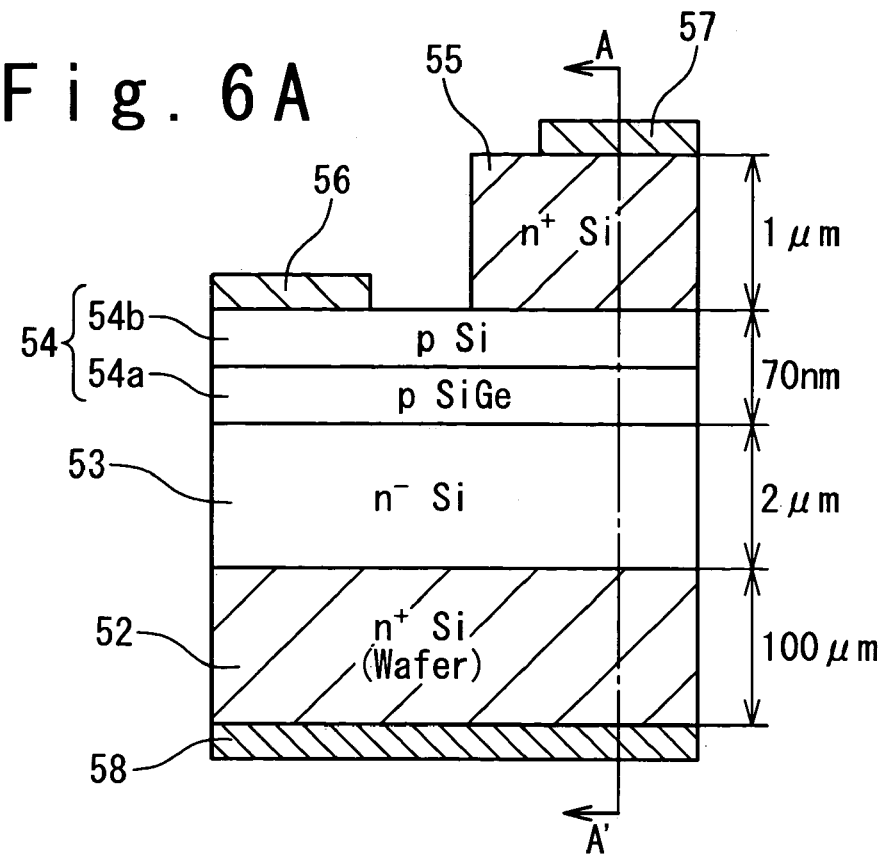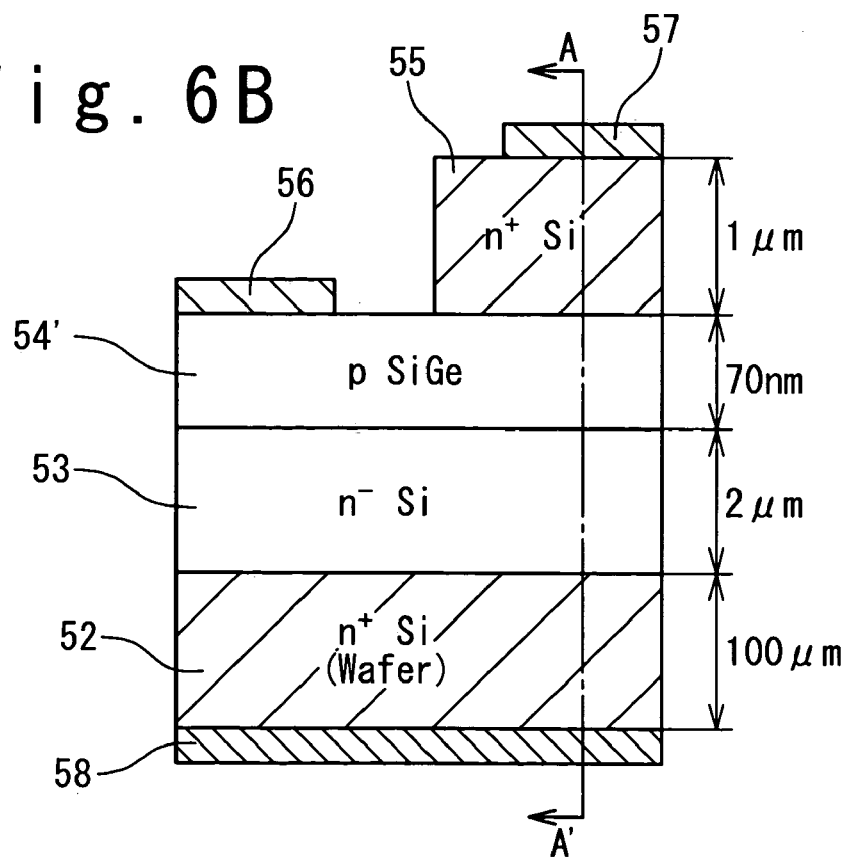

DC/DC CONVERTER USING BIPOLAR TRANSISTOR, METHOD OF MANUFACTURING THE SAME AND DC POWER SUPPLY MODULE USING THE SAME

CROSS-REFERENCE TO RELATED APPLICATION

This application is a continuation of an international application Ser. No. PCT/JP2004/009765, filed on Jul. 2, 2004, the entire disclosure of which is incorporated herein by reference.

BACKGROUND OF THE INVENTION

1. Field of the Invention

The present invention is generally related to a DC/DC converter and a DC power supply module which contains the same, particularly, to a DC/DC converter and a DC power supply module which contains the same, which are especially suitable for consumer electronics and built-in battery-powered apparatuses.

2. Description of the Related Art

DC/DC converters are utilized in a number of different switching power supply circuits. The basic switching power supply topologies are a step-up DC/DC converter and a step-down DC/DC converter, as disclosed in "Transistor Technology Special—Introduction to Practical Power Electronics—", published by CQ Publishing Company in August 1998.

An exemplary step-down DC/DC converter is illustrated in FIG. 1A, and designated by reference numeral 100. The DC/DC converter 100 includes a field effect transistor (FET) Q1, a diode D1, a diode D2, an inductor L, a capacitor C, an input terminal 11, an output terminal 12 and a grounded terminal 13, which may be also referred to as a common terminal. The FET Q1 receives an input DC voltage Vin on the drain thereof. The diode D1 has a cathode connected to a drain of the FET Q1, and an anode connected to a source of the FET Q1. The diode D2 has a cathode connected to the source of the FET Q1, and an anode connected to the grounded terminal. The inductor L is connected between the source of the FET Q1 and the output terminal. The capacitor C is connected between the output and grounded terminals. The FET Q1 may be replaced with an insulated gate bipolar transistor (IGBT).

When the FET Q1 is turned on, the input voltage Vin is applied to the inductor L, and power is delivered to the output terminal. An output voltage Vout is Vin-VL, where the VL is the voltage across the inductor L. The output voltage Vout also is formed across the capacitor C, thus the capacitor C charges and the output voltage increases each time the FET Q1 is turned on.

When the FET Q1 is turned off, the voltage across the inductor L reverses due to inductive flyback, thus making the diode D2 forward biased. A circuit loop generated by the diode D2 allows the energy stored in the inductor L to be delivered to the output terminal, wherein an output current is smoothed by the capacitor C. In this way, the input voltage Vin is converted to output voltage Vout. The output voltage can be controlled by varying the duty-cycle of the control voltage on the gate of FET.

The inductor L and the capacitor C are used for smoothing the ripple of the output voltage Vout. The FET Q1 is switched at a relatively high frequency to produce a chopped output voltage, however, the inductor L and the capacitor C operate together as an LC filter to produce a relatively smooth output voltage having a DC component with a reduced ripple voltage. The inductor and the capacitor are used to suppress the ripple voltage.

An exemplary step-up DC/DC converter is illustrated in FIG. 1B, and designated by reference numeral 101. The step-up type DC/DC converter 101 includes a field effect transistor (FET) Q2, a diode D1, a diode D2, an inductor L, a capacitor C, an input terminal 11, an output terminal 12 and a grounded terminal 13. The inductor L is connected between the input terminal 11 and a drain of the FET Q2. The FET Q2 receives Vin-VL on the drain terminal thereof, wherein the Vin is the input DC voltage and VL is the voltage across the inductor L. The diode D1 has a cathode connected to a drain of the FET Q2, and an anode connected to a source of the FET Q2. The diode D2 has a cathode connected to the output terminal, and an anode connected to the drain of the FET Q2. The capacitor C is connected between the output terminal and the grounded terminal. The FET Q2 may be replaced with an insulated gate bipolar transistor (IGBT). An operation of the DC/DC converter 101 is similar to that of the DC/DC converter 100.

Bipolar transistors are generally used as switching devices or amplifiers in a number of different circuit applications. Important requirements for bipolar transistors as switching devices are a high withstand voltage, a low voltage at its on-state, a high speed switching, and a high current gain. Conventional bipolar transistors are disclosed in Japanese Unexamined Patent Applications No. P2001-338928A and P2002-299602A.

An NPN bipolar transistor disclosed in No. P2002-299602A is illustrated in FIG. 2, and designated at reference numeral 200. The NPN bipolar transistor 200 includes a collector electrode 28, a collector 23 formed on the collector electrode 28, a base 24 formed on the collector 23, emitters 25 formed on the base 24, base electrodes 26 formed on the base 24, and emitter electrodes 27 formed on the emitters 25. A collector 23 consists of an N+ substrate 22, an N type region 23a and an N− type region 23b. The N+ substrate 22 is located at the bottom of the collector 23, and the region 23a is formed on the N+ substrate 22. The region 23b is formed between the region 23a and the base 24. A dopant concentration of the region 23b is higher than that of region 23a.

The structure 200 improves the current gain because the region 23b prevents hole injection into the region 23a.

An NPN silicon germanium transistor disclosed in Japanese Laid Open Patent Application No. P2001-338928A and its corresponding U.S. Pat. No. 6,423,989 is illustrated in FIG. 3, and designated at reference numeral 300. The NPN silicon germanium transistor 300 includes a collector electrode 37, a collector 31,32 formed on the collector electrode 37, a base 33,34 formed on the collector 31,32, an emitter 35,36 formed on the base, base electrodes 38 formed on the base 34 and emitter electrodes 39 formed on the emitter 36. For high current gain and high breakdown voltage, the base is formed of two layers: a P type silicon germanium layer 33 within which the lifetime and the mobility of the electrons are relatively reduced, and a P type silicon layer 34 within which the lifetime and the mobility of electrons are relatively increased. A germanium concentration in the base increases as distance from the collector decreases. This structure effectively improves transfer efficiency of electrons from the emitter 35 to the collector 32. As a result, the current gain is enhanced.

In many applications, the power loss of a DC/DC converter is to be suppressed to be as small as possible. The power loss of the DC/DC converter is generated at the on-state and transient state of turn-on and turn-off. Low saturation voltage at the on-state and short transient time at turn-on and turn-off are required when a switching semiconductor device is used in a DC/DC converter. However, a conventional FET or IGBT is not able to realize all these performance requirements in one device at the same time. Also, the on-state resistances of FETs and IGBTs tend to be high. The high on-state resistance causes power loss while FETs or IGBTs are turned on. Current FETs have only one advantage of high switching speed or low resistance; no FET is known having both of these advantages. IGBTs are useful for large capacity applications; however their transient times at turn-on or turn-off are as large as one microsecond, and the on-state voltages at the saturation state are as large as 1.5 voltage.

The slow switching speed of FETs and IGBTs limits the switching frequency of the DC/DC converters to below 1 MHz. The switching frequency limitation undesirably increases the ripple of the output voltage. In order to suppress the ripple voltage, a capacitor of large capacitance and an inductor of large inductance have to be used, which prevents a volume or size reduction of the DC/DC converters. The large inductance needs a coil of many turns, and the resistance and resistance loss of the inductor undesirably increases.

Accordingly, there is a need for a DC/DC converter which has a suppressed power loss and a reduced volume using a new switching semiconductor device.

SUMMARY OF THE INVENTION

In summary, the present invention addresses an improvement in DC/DC converters, a method of manufacturing the same and a DC power supply module which contains the same.

In detail, one object of the present invention is to provide DC/DC converters in which power loss is suppressed.

Another object of the present invention is to provide volume-reduced, compact-sized DC/DC converters.

In an aspect of the present invention, a DC/DC converter includes an input terminal receiving a DC power input from a battery and so forth, an output terminal for feeding DC power of a suitable and adjustable voltage, a grounded terminal, a smoothing capacitor connected between the output and grounded terminals, and a bipolar transistor. The bipolar transistor receives the DC power input through the input terminal to generate an output DC signal on the output terminal. A base of this bipolar transistor includes a silicon germanium (SiGe) layer.

The DC/DC converter of present invention has a suppressed power loss and a reduced volume because the new DC/DC converter of this invention uses a silicon germanium bipolar transistor with a high switching speed and low on-state voltage. The transistor with high switching speed can reduce the ripple voltage of the output. This ripple voltage can be realized with the small inductance and the small capacitance by high switching frequency. The volume of the DC/DC converter is reduced as the inductance and the capacitance is reduced. In addition, the transistor with low on-state voltage reduces power loss therein, because the power loss of the transistor potentially increases proportionally to the collector-emitter voltage while the transistor is in the on-state at which its voltage should be sufficiently saturated.

FIGS. 11A and 11B show another advantage of this invention: realizing low loss. FIG. 11A shows the switching speed of conventional switching devices like FETs, where t11 is the starting time of turn-on and t12 is the end time of turn-on, t13 is the starting time of turn-off, and t14 is the end time of turn-off. FIG. 11B shows the switching speed of the SiGe bipolar transistor of this invention, where t12 is the starting time of turn-on, t22 is the end time of turn-on, t23 is the starting time of turn-off, and t24 is the end time of turn-off.

The small transient time through turn-on or turn-off can decrease total switching losses in turn-on and turn-off, because the integration of product between Voltage and current through the transient time comes to be switching loss on each switching.

The SiGe transistor of this invention has a transient time on turn-on and turn-off that is 12 times smaller than conventional transistors like FETs.

In addition, the reduced inductance suppresses the power loss of the DC/DC converter because a small inductance can be achieved by a coil of fewer turns, which thus has a small resistance.

In another aspect of present invention, the DC/DC converter preferably further includes an inductor connected between an emitter of the bipolar transistor and the output terminal, a diode having a cathode connected to the emitter of the bipolar transistor and an anode connected to the grounded terminal. The collector of the bipolar transistor is connected to the input terminal.

The DC/DC converter preferably further includes another diode having a cathode connected to the collector of the bipolar transistor and an anode connected to the emitter of the bipolar transistor.

The base of the silicon germanium bipolar transistor preferably includes a silicon layer in addition to the silicon germanium layer. The silicon layer is formed on the emitter. The silicon germanium layer is formed on the collector. Preferable concentration of the germanium ranges from 6 to 16%. The thickness of the base of the silicon germanium bipolar transistor is preferably in the range between 60 and 90 nm. A thickness of the collector is preferably in the range between 1.5 and 2.5 μm.

The base of the silicon germanium bipolar transistor preferably includes another silicon germanium layer in addition to the first silicon germanium layer. The first silicon germanium layer is formed on the collector and the other silicon germanium layer is formed on the emitter. The germanium concentration of the silicon germanium layer ranges from 6 to 16%. The germanium concentration of the other silicon germanium layer is preferably less than that of the first silicon germanium layer. The thickness of the base of the silicon germanium bipolar transistor is preferably in the range between 60 and 90 nm. A thickness of the collector is preferably in the range between 1.5 and 2.5 μm.

The germanium concentration of the base preferably increases as distance from the collector decreases. The germanium concentration at the interface between the base and the collector preferably ranges from 6% to 16%. The thickness of the base of the silicon germanium bipolar transistor is preferably in the range between 60 and 90 nm. A thickness of the collector is preferably in the range between 1.5 and 2.5 μm. A dopant concentration of the collector is preferably in the range between $5 \times 10^{14}$ to $1 \times 10^{16}$ cm$^{-3}$.

The DC/DC converter preferably further includes a field effect transistor having a source connected to the emitter of SiGe bipolar transistor and a drain connected to the grounded terminal.

In still another aspect of present invention, the DC/DC converter preferably further includes an inductor connected between the input terminal and the collector of the bipolar transistor and a diode having a cathode connected to the output terminal and an anode connected to the collector of the bipolar transistor. The emitter of the bipolar transistor is connected to the grounded terminal.

The DC/DC converter preferably further includes another diode having a cathode connected to the collector of the bipolar transistor and an anode connected to the emitter of the bipolar transistor.

The base of the silicon germanium bipolar transistor preferably includes a silicon layer in addition to the silicon germanium layer. The silicon layer is formed on the emitter. The silicon germanium layer is formed on the collector. Preferable concentration of the germanium ranges from 6 to 16%. The thickness of the base of the silicon germanium bipolar transistor is preferably in the range between 60 and 90 nm. A thickness of the collector is preferably in the range between 1.5 and 2.5 μm. A dopant concentration of the collector is preferably in the range between $5 \times 10^{14}$ to $1 \times 10^{16}$ cm$^{-3}$.

The base of the silicon germanium bipolar transistor preferably includes another silicon germanium layer in addition to the first silicon germanium layer. The first silicon germanium layer is formed on the collector and the other silicon germanium layer is formed on the emitter. The germanium concentration of the silicon germanium layer ranges from 6 to 16%. The germanium concentration of the other silicon germanium layer is preferably less than that of the silicon germanium layer. The thickness of the base of the silicon germanium bipolar transistor is preferably in the range between 60 and 90 nm. A thickness of the collector is preferably in the range between 1.5 and 2.5 μm. A dopant concentration of the collector is preferably in the range between $5 \times 10^{14}$ to $1 \times 10^{16}$ cm$^{-3}$.

The germanium concentration of the base preferably increases as distance from the collector decreases. The germanium concentration at the interface between the base and the collector preferably ranges from 6% to 16%. The thickness of the base of the silicon germanium bipolar transistor is preferably in the range between 60 and 90 nm. A thickness of the collector is preferably in the range between 1.5 and 2.5 μm. A dopant concentration of the collector is preferably in the range between $5 \times 10^{14}$ to $1 \times 10^{16}$ cm$^{-3}$.

The DC/DC converter preferably further includes a field effect transistor having a source connected to the grounded terminal and a drain connected to the emitter of SiGe bipolar transistor.

The aforementioned DC/DC converters may be integrated into a DC power supply module. The DC power supply module includes some aforementioned DC/DC converters, a common input terminal, and a common grounded terminal. Each input terminal of the DC/DC converters is connected to the common input terminal, and each grounded terminal of the DC/DC converters is connected to the common grounded terminal. The DC power supply module may have a plurality of common input terminals and a plurality of common grounded terminals. The input terminals of the DC/DC converters are connected to selected one of the common input terminals, and the grounded terminals of the DC/DC converters are connected to selected one of the common input terminals.

The DC/DC converter of the present invention is manufactured by a method including steps of forming a silicon germanium bipolar transistor and assembling the silicon germanium bipolar transistor, an inductor, a smoothing capacitor, a diode, an input terminal, an output terminal, and a grounded terminal into a DC/DC converter. A step-down DC/DC converter is assembled by the following steps: connecting a collector of the silicon germanium bipolar transistor to the input terminal, connecting the inductor between the output terminal and an emitter of the transistor, connecting the smoothing capacitor between the output and grounded terminals, connecting a cathode of the diode to the emitter of the bipolar transistor and connecting an anode of the diode to the grounded terminal, and connecting the anode of another diode to the emitter of the bipolar transistor and its cathode to the collector of the bipolar transistor. A step-up DC/DC converter is assembled by the following steps: connecting an emitter of the transistor to the grounded terminal, connecting the inductor between the input terminal and a collector of the transistor, connecting an anode of the diode to the collector, connecting a cathode of the diode to the output terminal, connecting the smoothing capacitor between the output and grounded terminals, and connecting the anode of another diode to the emitter of the bipolar transistor and its cathode to the collector of the bipolar transistor.

BRIEF DESCRIPTION OF THE DRAWINGS

FIG. 6A is a cross sectional view of the silicon germanium bipolar transistor according to the embodiment of the present invention;

FIG. 6B is a cross sectional view of the silicon germanium bipolar transistor according to the embodiment of the present invention;

DESCRIPTION OF THE PREFERRED EMBODIMENTS

Figure 1A:
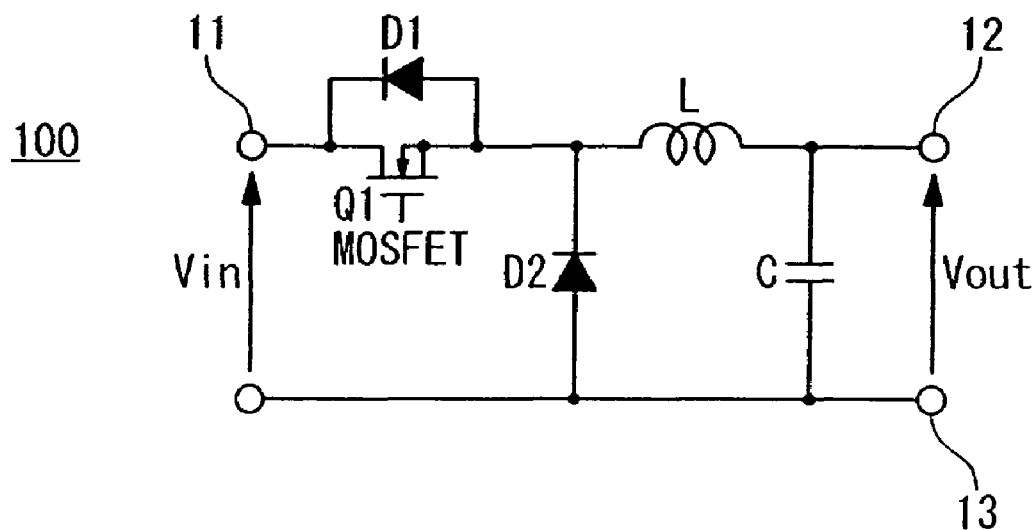
FIG. 1A is a schematic circuit diagram illustrating a conventional step-down DC/DC converter.
Figure 1B:
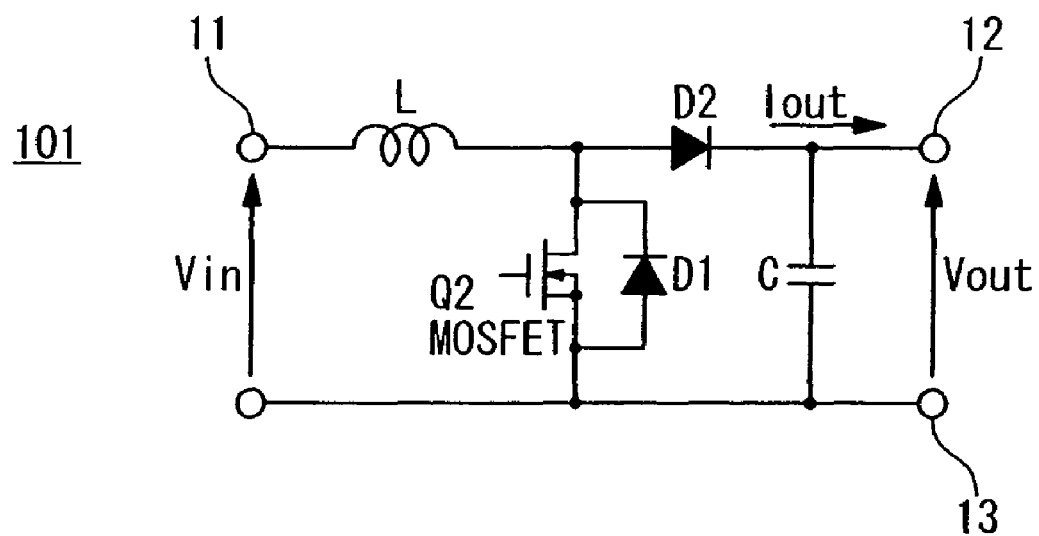
FIG. 1B is a schematic circuit diagram illustrating a conventional step-up DC/DC converter.
Figure 2:
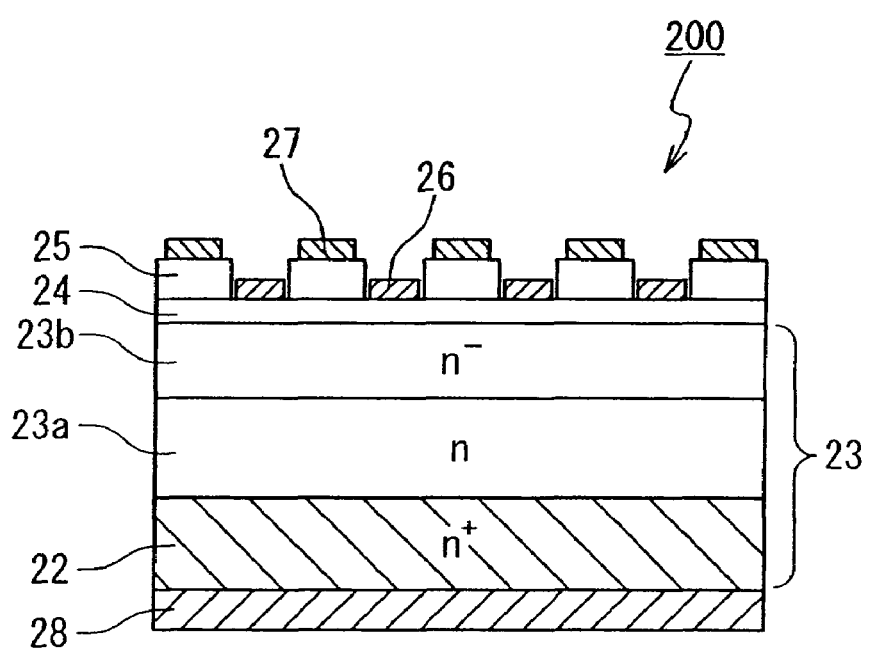
FIG. 2 is a cross-sectional view of a conventional bipolar transistor.
Figure 3:
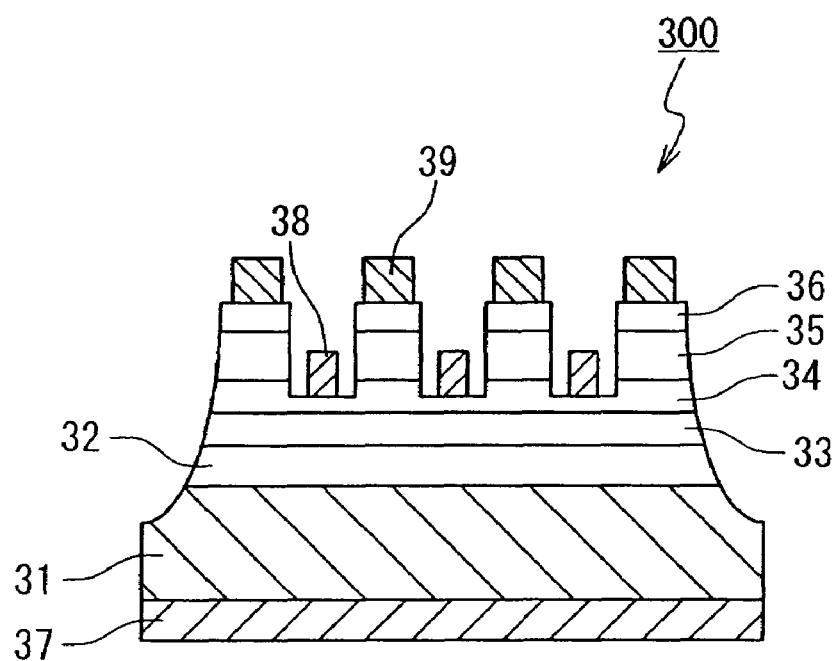
FIG. 3 is a cross sectional view of a conventional silicon germanium bipolar transistor.

Preferred embodiments of the present invention are described below in detail with reference to the attached drawings. In the drawings, like or similar elements are designated with identical reference numerals throughout the several views thereof, and the various elements depicted are not necessarily drawn to scale.

DC/DC Converter Structure

Figure 4A:
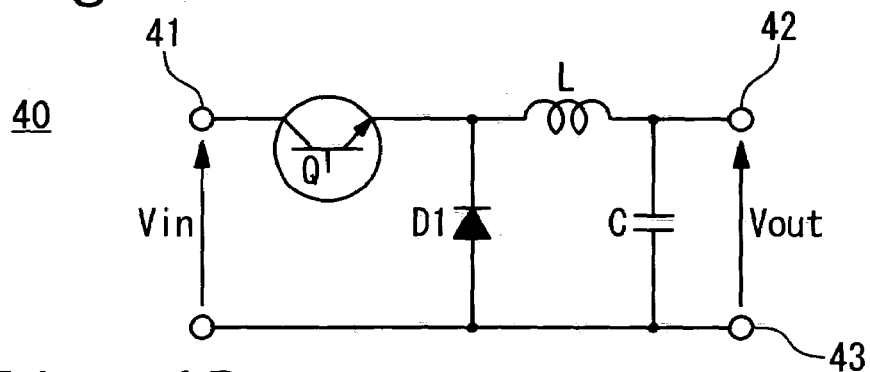
FIG. 4A is a schematic circuit diagram illustrating a step-down DC/DC converter according to an embodiment of the present invention.

In one embodiment, a step-down DC/DC converter is illustrated in FIG. 4A, and designated at reference numeral 40. The DC/DC converter 40 includes a silicon germanium bipolar transistor Q, a diode D1, an inductor L, a smoothing capacitor C, an input terminal 41, an output terminal 42, and a grounded terminal 43. The silicon germanium bipolar transistor Q receives an input DC voltage Vin on the collector thereof. The diode D1 has a cathode connected to an emitter of the transistor Q. The inductor L is connected between the emitter and the output terminal 42. The smoothing capacitor C is connected between the output and grounded terminals 42,43.

The operation of the silicon germanium bipolar transistor Q is described below.

When the transistor Q is turned on, the input voltage Vin is applied to the inductor L and power is delivered to the output terminal. An output voltage Vout is Vin−VL, wherein the VL is the voltage across the inductor L. The output voltage Vout also is formed across the smoothing capacitor C, and thus the capacitor C charges and the output voltage increases each time the transistor Q is turned on.

When the transistor Q is turned off, the voltage across the inductor L reverses due to inductive flyback, thus making the diode D1 forward biased. A circuit loop generated by the diode D1 allows the energy stored in the inductor L to be delivered to the output terminal 42, wherein the output current is smoothed by the smoothing capacitor C. The output voltage can be controlled by varying the duty-cycle of the control current to the base of the bipolar transistor control voltage. In this way, the input voltage Vin is converted to the output voltage Vout having a DC component with a reduced ripple voltage.

Figure 4B:
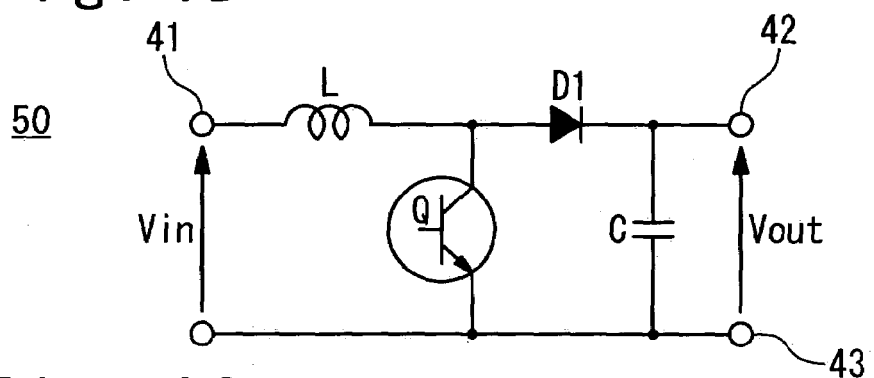
FIG. 4B is a schematic circuit diagram illustrating a step-up DC/DC converter according to an alternative embodiment of the present invention.
Figure 4C:
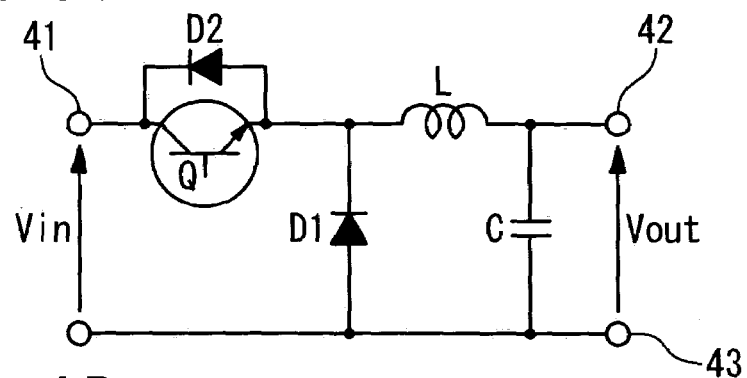
FIG. 4C is a schematic circuit diagram illustrating a step-down DC/DC converter according to an alternative embodiment.

The DC/DC converter 40 preferably further includes another diode D2 as shown in FIG. 4C. The diode D2 has a cathode connected to the collector of the transistor Q, and an anode connected to the emitter of the transistor Q. The diode D2 protects the transistor Q against a surge voltage into the emitter.

Figure 5A:
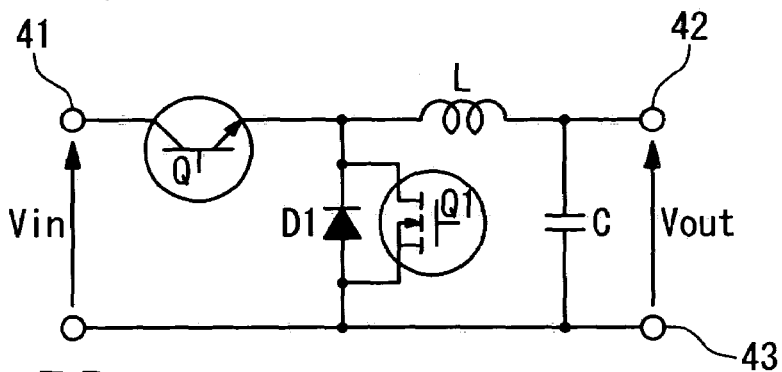
FIGS. 5A, 5B, 5C and 5D are schematic circuit diagrams illustrating DC/DC converters according to alternative embodiments.
Figure 5B:
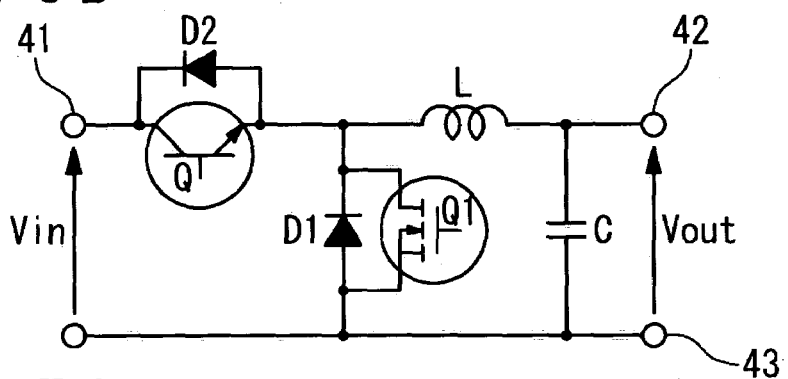
Figure 5C:
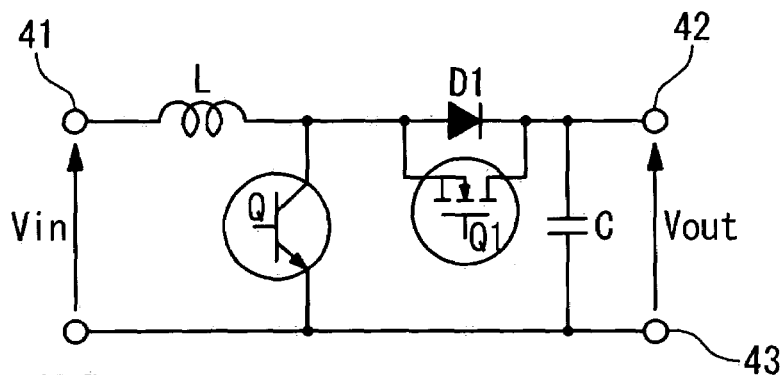
Figure 5D:
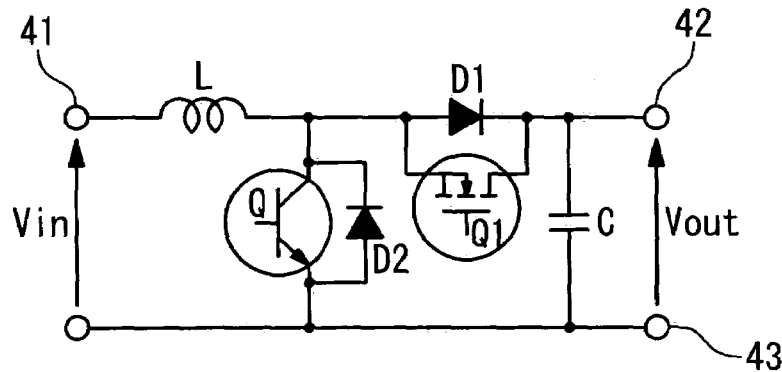

The DC/DC converter 40 may further include a field effect transistor Q1 as shown in FIGS. 5A and 5C. The field effect transistor Q1 and the diode D1 are connected in parallel between the grounded terminal 43 and the emitter of the silicon germanium bipolar transistor Q. A drain of the field effect transistor Q1 is connected to the cathode of the diode D1. The field effect transistor Q1 is turned on synchronously with turn-off of the silicon germanium bipolar transistor Q. The diode D1 is forward biased at the same time. A circuit loop generated by the field effect transistor Q1 and the diode D1 allows the energy stored in the inductor L to be delivered to the output terminal 42 and capacitor C. Because of the resistance of the diode D1, the output current flows through the field effect transistor Q1 more than the diode D1. The power loss of the DC/DC converter is reduced because the power loss of the field effect transistor Q1 is less than that of the diode D1.

In an alternative embodiment, a step-up DC/DC converter is illustrated in FIG. 4B, and designated by reference numeral 50. The DC/DC converter 50 includes an inductor L, a silicon germanium bipolar transistor Q, a diode D1 a smoothing capacitor C, an input terminal 41, an output terminal 42 and a grounded terminal 43. The inductor L is connected between the input terminal 41 and a collector of the transistor Q. The transistor Q has an emitter connected to the grounded terminal 43. The diode D1 has a cathode connected to the output terminal 42 and an anode connected to the collector of the transistor Q. The smoothing capacitor C is connected between the output terminal 42 and grounded terminals 43.

When the transistor Q is turned on, a circuit loop is generated by the inductor L and the switched transistor Q. The input voltage Vin is applied to the inductor L and the energy is stored in the inductor L. The diode D1 is reverse biased.

When the transistor Q is turned off, the voltage across the inductor L reverses due to inductive flyback, thus making the diode D1 forward biased. The energy stored in the inductor L is then delivered to the output terminal 42, wherein an output current is smoothed by the capacitor C. The output voltage is Vin+VL, wherein the VL is the voltage across the inductor L. The output voltage Vout is also formed across the capacitor C, thus the capacitor C is charged and the output voltage increases each time the transistor Q1 is turned off. In this way the input voltage Vin is converted to output voltage Vout.

Figure 4D:
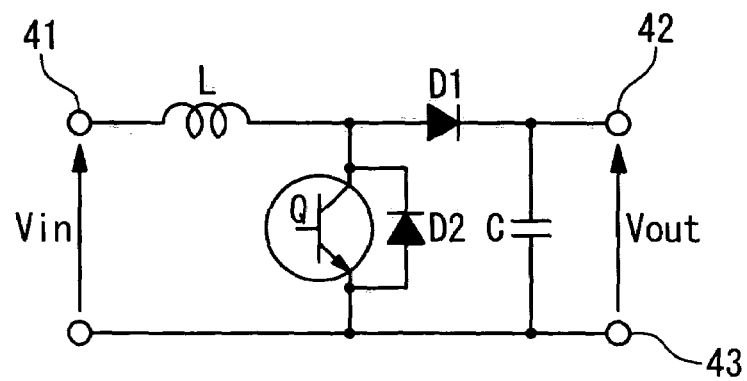
FIG. 4D is a schematic circuit diagram illustrating a step-up DC/DC converter according to an alternative embodiment.

The DC/DC converter 50 preferably further includes another diode D2 as shown in FIG. 4D. The diode D2 has a cathode connected to the collector of the transistor Q, and an anode connected to the emitter of the transistor Q. The diode D2 protects the transistor Q from surge voltage.

As is the case of the step-down DC/DC converter shown in FIGS. 5A and 5B, the DC/DC converter 50 may further include a field effect transistor. The field effect transistor Q1 and the diode D1 are connected in parallel between the grounded terminal 43 and the collector of the silicon germanium bipolar transistor Q. A drain of the field effect transistor Q1 is connected to the cathode of the diode D1. The field effect transistor Q1 is turned on synchronously with turn-off of the silicon germanium bipolar transistor Q. The diode D1 is forward biased at the same time. A circuit loop generated by the field effect transistor Q1 and the diode D1 allows the energy stored in the inductor L to be delivered to the output terminal 42. Because of the resistance of the diode D1, an output current flows through the field effect transistor Q1 more than the diode D1. The power loss of the DC/DC converter is reduced more because the power loss of the field effect transistor Q1 is less than that of the diode D1.

The aforementioned DC/DC converters are manufactured by a method including the steps of forming the silicon germanium bipolar transistor Q and assembling the silicon germanium bipolar transistor Q, the inductor L, the smoothing capacitor C, the diode D1, the input terminal 41, the output terminal 42, and grounded terminal 43 into a DC/DC converter. In detail, the step-down DC/DC converter is assembled by the following steps of: connecting the collector of the silicon germanium bipolar transistor Q to the input terminal 41, connecting the inductor L between the output terminal 42 and an emitter of the transistor Q, connecting the smoothing capacitor C between the output terminal 42 and grounded terminal 43, connecting an anode of the diode D1 to the emitter, and connecting a cathode of the diode D1 to the output terminal. The step-up DC/DC converter is assembled by the following steps of: connecting an emitter of the transistor Q to the grounded terminal 43, connecting the inductor L between the input terminal 41 and a collector of the transistor Q, connecting an anode of the diode D1 to the collector, connecting a cathode of the diode D1 to the output terminal 42, and connecting the smoothing capacitor C between the output and grounded terminals 42, 43.

Use of a silicon germanium bipolar transistor for the switching transistor Q effectively allows the aforementioned DC/DC converters to have a reduced volume due to the high switching speed thereof. A transistor with high switching speed lowers a ripple of the output voltage of the DC/DC converter. The small ripple voltage can be sufficiently suppressed by small inductance and small capacitance. The volume of the DC/DC converter is thus reduced as the inductance and the capacitance is reduced.

In addition, the use of the transistor with low on-state voltage allows the DC/DC converter to have suppressed power loss. The low on-state voltage, that is, the low collector-emitter voltage while the transistor Q is turned on, decreases the power loss of the DC/DC converter because a power loss in the transistor increases proportionally to the collector-emitter voltage while the transistor Q is turned on.

In addition, the small inductance suppresses the power loss of the DC/DC converter because a small inductance can be achieved by a coil of fewer turns, which has a small resistance.

Silicon Germanium Bipolar Transistor Structure

Although having advantages of high switching speed and low on-state voltage, conventional silicon germanium transistors suffer from low withstand voltage and low current gain $h_{fe}$. This prevents the use of silicon germanium transistors as switching transistors within DC/DC converters.

Nevertheless, the inventors has proved that these drawbacks can be overcome through optimization of the structure of the base and collector layers, the optimization including adopting the appropriate germanium concentration and distribution, and appropriately adjusting the thicknesses of the base and collector layers. Details of the silicon germanium bipolar transistor Q used in above embodiments are described in Japanese patent No. P2002-299602A and its corresponding U.S. Pat. No. 6,660,623, the disclosure of which is incorporated herein by reference.

FIG. 6A shows a cross sectional view of the silicon germanium bipolar transistor Q. The transistor Q includes an N+ type silicon substrate 52, a collector layer 53, a base layer 54, and an emitter layer 55. A collector electrode 58 is formed on the rear surface of the substrate 52, and a base electrode 56 is formed on the base layer 54 and an emitter electrode 57 is formed on the emitter layer 55. The collector layer 53 is an N− type silicon layer formed on the silicon substrate 52. The base layer 54 is composed of a P type silicon germanium layer 54a and a P type silicon layer 54b. The emitter layer 55 is an N+ type silicon or N+ type amorphous silicon layer.

Figure 7:
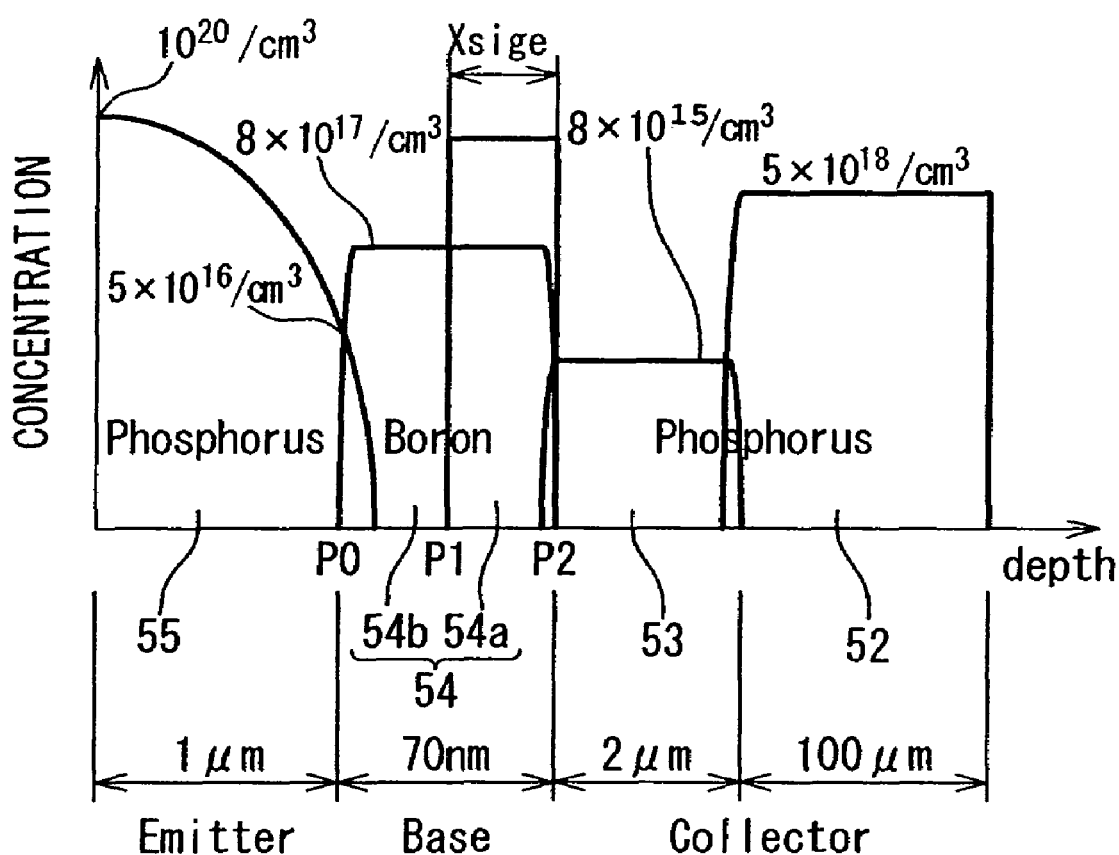
FIG. 7 is a graph of dopant and germanium concentrations versus depth from the surface of the emitter, taken at A–A' in FIG. 6A.

FIG. 7 shows profiles of dopant and germanium concentrations versus depth from the surface of the emitter, taken on the A–A' section in FIG. 6A. An interface of the emitter layer 55 and the P type silicon layer 54b is designated at P0, an interface of the silicon germanium layer 54a and the P type silicon layer 54b is designated at P1, and an interface of the silicon germanium layer 54a and the collector layer 53 is designated at P2. A distance between P1 and P2, which is a thickness of the silicon germanium layer 54a, is designated as Xsige.

The N type dopant for the substrate 52 includes phosphorus and arsenic. The substrate 52 has a dopant concentration preferably in the range between $1 \times 10^{18}$ and $3 \times 10^{20}$ cm$^{-3}$. The substrate 52 preferably has a thickness of 100 to 500 μm. In this embodiment, the substrate 52 has a dopant concentration of $5 \times 10^{18}$ cm$^{-3}$ and the thickness of 100 μm.

The N type dopant for the collector layer 53 includes phosphorus and arsenic. The collector layer 53 has a dopant concentration preferably in the range between $5 \times 10^{14}$ and $1 \times 10^{16}$ cm$^{-3}$. The collector layer 53 preferably has a thickness of 1.5 to 2.5 μm. The collector layer 53, which has the dopant concentration and thickness in the aforementioned range, advantageously improves the breakdown voltage of the transistor. In this embodiment, the collector layer 53 has a dopant concentration of $8 \times 10^{15}$ cm$^{-3}$ and a thickness of 2 μm.

The P type dopant for the base layer 54 includes boron. The base layer 54 has a dopant concentration preferably in the range between $3 \times 10^{17}$ and $8 \times 10^{17}$ cm$^{-3}$. A total thickness of the base layer 54 is preferably in the range between 60 and 90 nm. The base layer less than 60 nm in thickness undesirably lowers the breakdown voltage and the base layer more than 90 nm in thickness undesirably lowers the current gain $h_{fe}$. In this embodiment, the total base layer 54 has a dopant concentration of $8 \times 10^{17}$ cm$^{-3}$ and the thickness of 70 nm.

Figure 8:
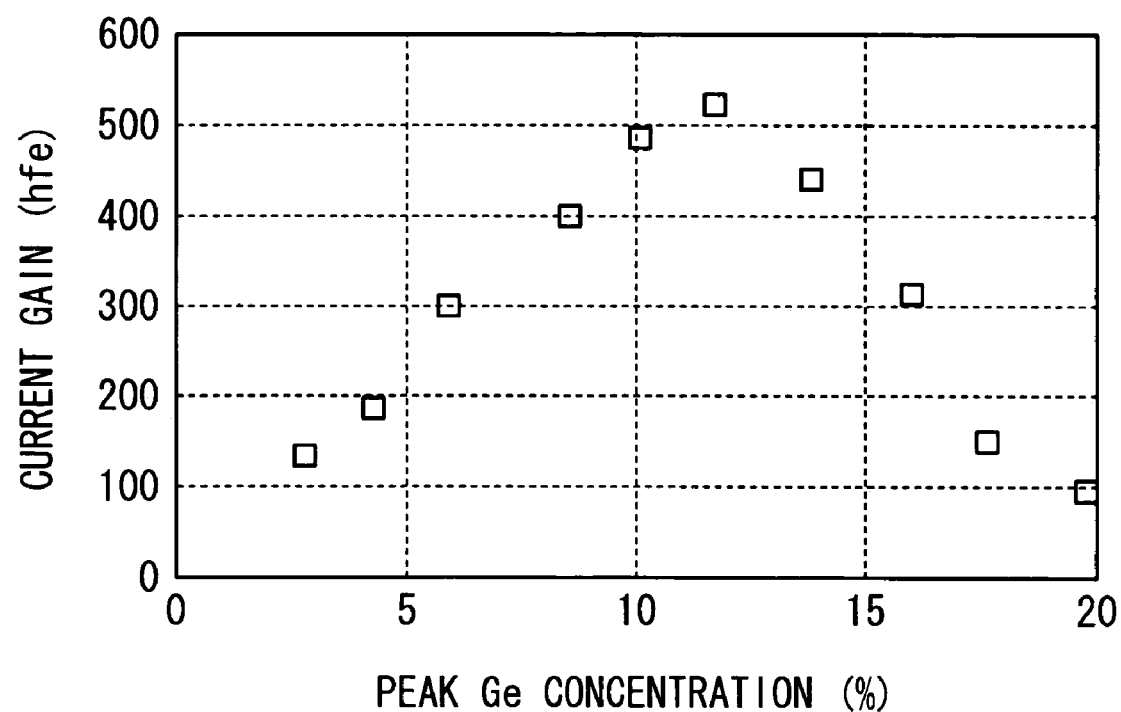
FIG. 8 is a graph of current gain $h_{fe}$ versus maximum germanium concentration.

The germanium concentration in the silicon germanium layer 54a has trapezoidal distribution. The maximum germanium concentration is preferably in the range between 6 and 16%. FIG. 8 is a graph of the current gain $h_{fe}$ versus maximum germanium concentration of the silicon germanium layer 54a. In order to achieve a current gain more than 300, the maximum germanium concentration is required to be in the range between 6 and 16%. For a current gain more than 400, the maximum germanium concentration is required to be in the range between 8 and 13%.

Referring back to FIG. 7, the thickness of the silicon germanium layer 54a is preferably in the range of 20 to 60 nm. If the thickness of the silicon germanium layer 54a is more than 60 nm, the thickness of the silicon layer 54b is restricted below 10 nm, which undesirably lowers the current gain $h_{fe}$. If the thickness of the silicon germanium layer 54a is reduced below 20 nm, the breakdown voltage is undesirably lowered below 50V. In this embodiment, the maximum germanium concentration is 10%, the base layer 54a is 50 nm in thickness, and the total base layer 54 is 70 nm in thickness.

The N type dopant for the emitter layer 55 includes phosphorus and arsenic. The dopant in the emitter layer 55 has a Gaussian distribution. The concentration at the surface of the emitter layer 55 is $1 \times 10^{20}$ cm$^{-3}$, which is the peak value. The concentration at the interface P0 between the emitter layer 55 and the base layer 54b is $5 \times 10^{16}$ cm$^{-3}$. The dopant may have a trapezoidal distribution in place of a Gaussian distribution. The thickness of the emitter layer 55 is preferably in the range between 0.5 and 2 μm. In this embodiment, the emitter is 1 μm in thickness.

In an alternative embodiment, the silicon layer 54b may be replaced with a silicon germanium layer whose germanium concentration is less than 3%. In this case, as described above, the germanium concentration of the silicon germanium layer 54a preferably has a trapezoidal distribution. The maximum germanium concentration of the trapezoidal distribution is preferably in the range between 6 and 16%, more preferably, between 8 and 13%.

In an alternative embodiment, as shown in FIG. 6B, the silicon germanium layer 54a and the silicon layer 54b may be replaced with a silicon germanium base layer 54'. The germanium distribution of the base layer 54' is different from that of the base layer 54.

Figure 9:
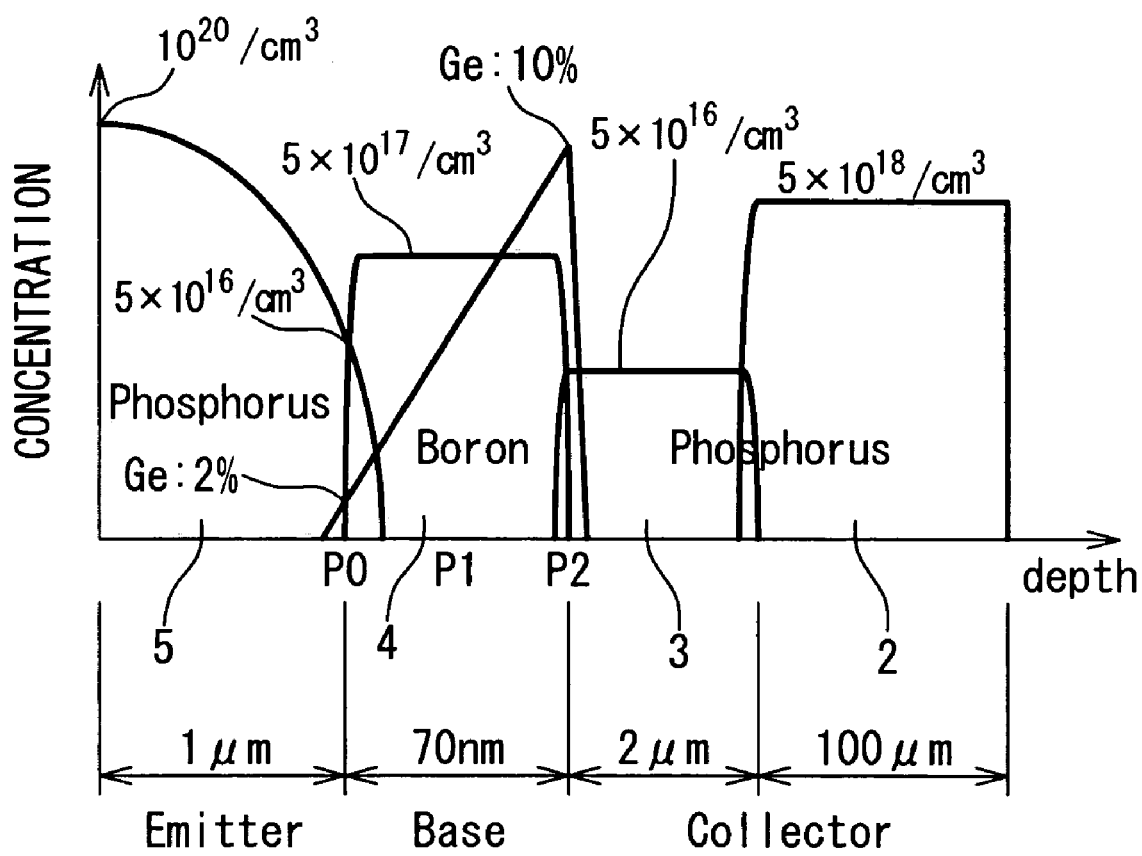
FIG. 9 is a graph of dopant and germanium concentrations versus depth from the surface of the emitter taken at A–A' in FIG. 6B.

FIG. 9 shows profiles of dopant and germanium concentration versus depth from the surface of the emitter, taken on the A–A' section in FIG. 6B. An interface of the emitter layer 55 and the base layer 54' is designated at P0 and an interface of the base layer 54' and the collector layer 53 is designated at P2. The germanium concentration in the base layer 54' increases as the distance from the collector decreases and the germanium concentration peaks at the interface P2. The maximum germanium concentration is preferably in the range between 8 and 13%. The germanium concentration at the interface P0 is preferably less than 3%. In this embodiment, the germanium concentration is 10% at the interface P2 and 2% at the interface P0.

Figure 10:
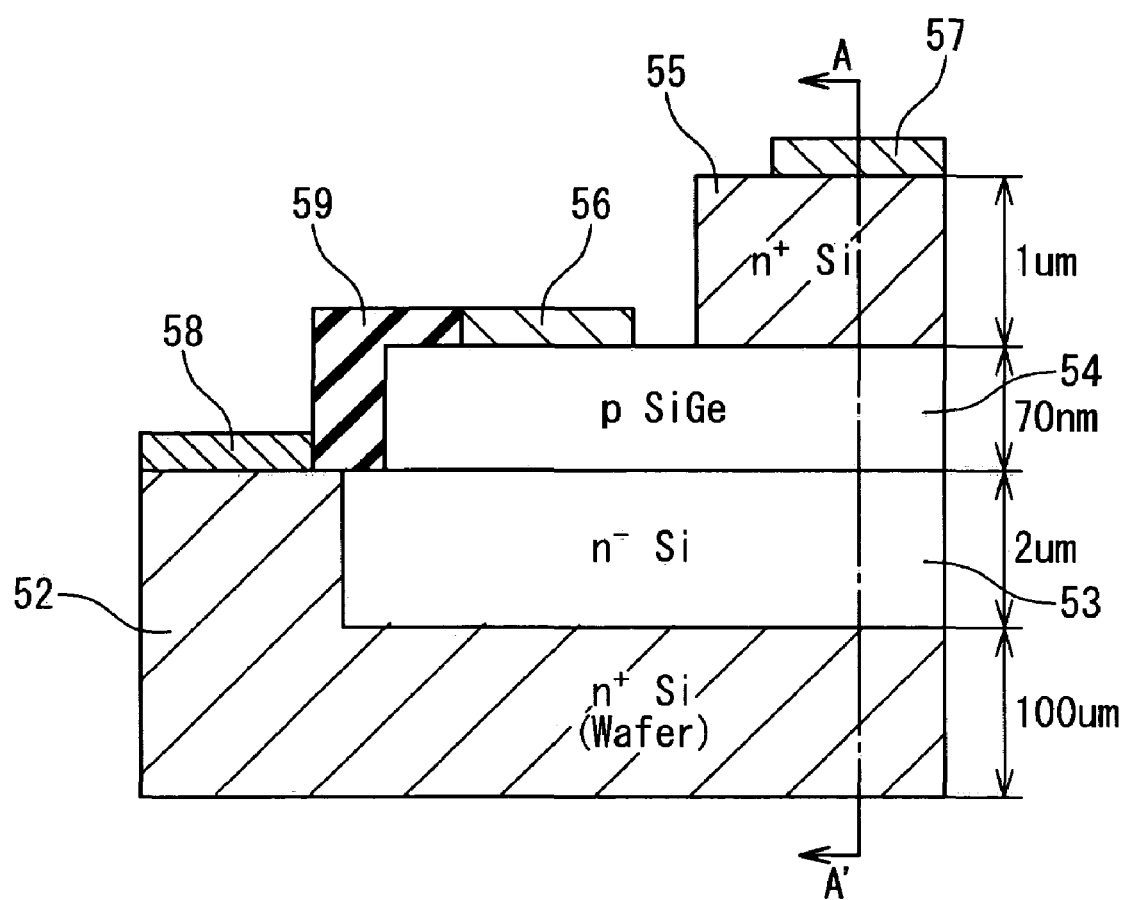
FIG. 10 is a cross sectional view of a silicon germanium bipolar transistor of planar structure.

In an alternative embodiment, the transistors Q1 may adopt a planar structure as shown in FIG. 10. The planar type transistor shown in FIG. 10 includes a SiO2 layer 59 connected between the base and collector electrodes 56 and 58. Dopant and germanium concentration profiles of the planar transistor are identical with those of the vertical transistor.

Comparison of the Present Invention and the Conventional Technique

A characteristics comparison of the DC/DC converter of the present invention and the conventional DC/DC converter is described in the following.

Figure 11A:
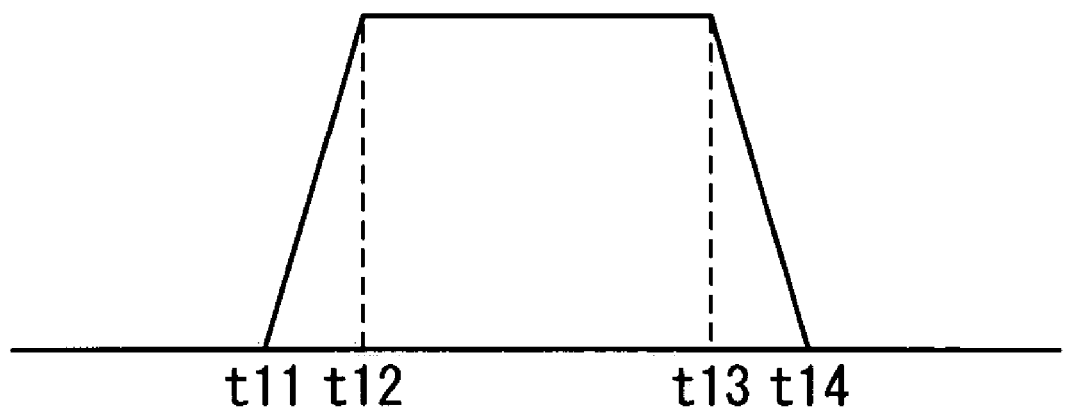
FIG. 11A is a schematic switching speed characteristics diagram of a field effect transistor used in conventional DC/DC converters.
Figure 11B:
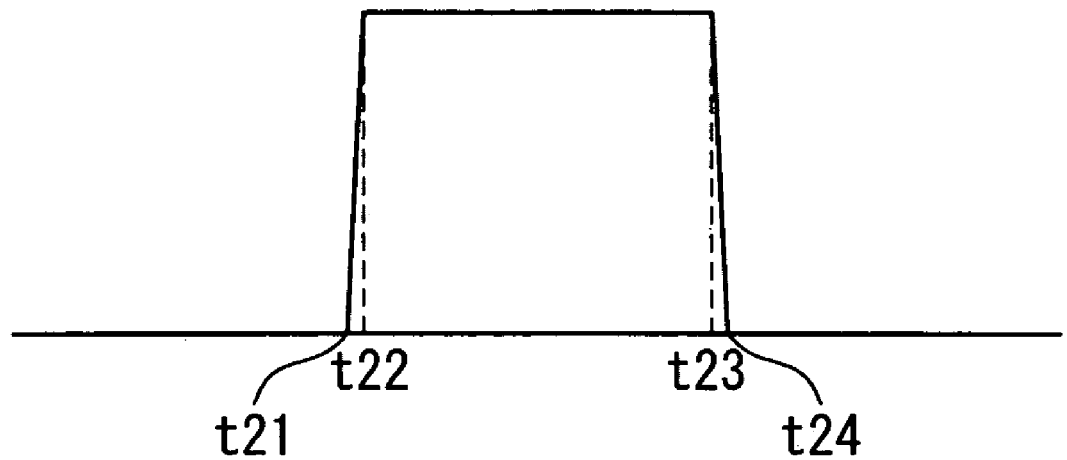
FIG. 11B is a schematic switching speed characteristics diagram of a silicon germanium bipolar transistor used in DC/DC converters of present invention.

FIGS. 11A and 11B shows the switching speed characteristics diagrams of the DC/DC converter of present invention and the conventional DC/DC converter in terms of output currents versus time. The DC/DC converter of the present invention includes the silicon germanium bipolar transistor, while the conventional DC/DC converter includes a field effect transistor.

The conventional DC/DC converter requires more than 5 ns to switch from the off state (no current; t11) to the on state (steady state; t12) as shown in FIG. 11A. It also requires more than 5 ns to switch from the on state (t13) to the off state.

On the other hand, the DC/DC converter of the present invention takes 0.5 ns to switch from the off state (t21) to the on state (t22) and 0.5 ns from the on state (t23) to the off state (t24) as shown in FIG. 11B.

The small transient time through turn-on or turn-off can decrease total switching losses in turn-on and turn-off, because the integration of product between Voltage and current through the transient time comes to be switching loss on each switching. The SiGe transistor of the present invention has a transient time on turn-on and turn-off 12 times smaller than conventional transistors like FETs. Because of the short transient switching time 12 times smaller than a conventional transistor like FET, the switching frequency of the DC/DC converter can be increased up to several tens of MHz.

The DC/DC converter switching frequency of the present invention is several tens of times as large as that of the conventional DC/DC converter, which allows a reduction in the inductance and the smoothing capacitance. The inductance and the capacitance of the present invention are 12 times smaller than those of the conventional DC/DC converter for the same ripple control specifications. The reduced inductance reduces coil resistance down, which results in a reduction of power loss in the inductor.

Advantageous effects of the DC/DC converter described in the above embodiments will be described in comparison with the conventional DC/DC converter. The DC/DC converter of present invention described in FIG. 4C and the conventional DC/DC converter described in FIG. 1A will be compared under conditions described in the following.

The same specifications for both the present and the conventional DC/DC converters are an input voltage of 3.6 V, an output voltage of 3.0 V, an output current of 0.5 A and a maximum ripple voltage of 10 mV. These are typical requirements for portable apparatuses such as cellular phones and portable computers.

Specifications of the silicon germanium bipolar transistor with a device area of 0.36 mm$^2$ and the silicon based field effect transistor with the same device area are described below.

A. Silicon Germanium Bipolar Transistor with a Device Area of 0.36 mm$^2$
  1) Rated current: 1.0 A
  2) Rated collector-emitter breakdown voltage: 50 V
  3) Collector-emitter on-state voltage at a junction temperature of 100° C.: 0.10 V (on-state resistance is 100 mΩ for current of 1 A)
  4) Turn-on time at a junction temperature of 100° C.: 0.5 nsec
  5) Turn-off time (at a junction temperature of 1000° C.: 0.5 nsec
  6) Current gain h$_{fe}$ at a junction temperature of 1000° C.: over 500 at on-state of saturated voltage B. Silicon-based Field Effect Transistor with Device Area of 0. 36 mm$^2$
  1) Rated drain-source current: 1.0 A
  2) Rated drain-source breakdown voltage: 50 V
  3) Drain-source on-state resistance at a junction temperature of 100° C.: 420 mΩ
  4) Turn-on time at a gate voltage of 10V: 5.0 nsec
  5) Turn-off time at a gate voltage of 10V): 5.0 nsec The necessary inductance and capacitance of the inductors and the smoothing capacitors for the present and the conventional DC/DC converters has been calculated. For the DC/DC converter according to the present invention which has a switching frequency of 20 MHz, an inductance of 0.25 µH and a capacitance of 0.05 µF are required to satisfy the above specification.

On the other hand, for the conventional DC/DC converter which has a restricted switching frequency below 1 MHz due to the use of a conventional field effect transistor (FET), an inductance of 5 µH and a capacitance of 1 µF are required.

As described above, the DC/DC converter of the present invention has the switching frequency of 20 MHz, and the inductance and the capacitance are reduced to 5% of those of the conventional DC/DC converter.

The efficiencies of the present and the conventional DC/DC converters are evaluated as described in the following. The efficiencies are evaluated in terms of the power loss of the switching transistor during the turn-on time and turn-off time, the power loss of the diode D2 during the turn-on time, the reverse recovery loss and the power loss of the inductor. The efficiency of the DC/DC converter of the present invention is 90% for an output current of 1 A, and 92% for 0.5 A. On the other hand, the efficiency of the conventional DC/DC converter is 80% for an output current of 1 A, and 83% for 0.5 A.

In addition, the investigation by the inventors has proved that the DC/DC converter of the present invention requires an area less than one tenth of that of the conventional DC/DC converter, because of the reduction in the inductance and the capacitance.

Preferred Use of the DC/DC Converter

Figure 12A:
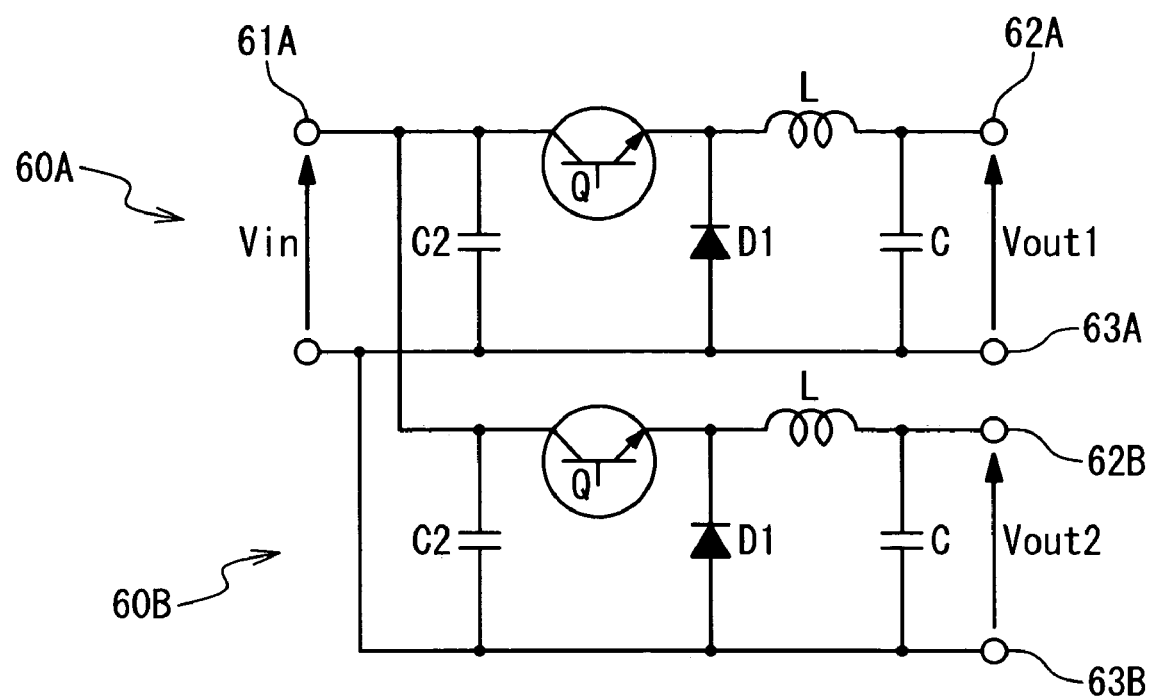
FIGS. 12A and 12B are schematic circuit diagrams of DC power supply modules according to an embodiment of present invention.

The aforementioned DC/DC converters may be integrated into a DC power supply module. A DC power supply module shown in FIG. 12A includes two step-down DC/DC converters 60A, 60B, a common input terminal 61, and a common grounded terminal 63. Each of the DC/DC converters 60A, 60B has an output terminal 62A, 62B which is used as the output terminal of the DC power supply module. Each of the DC/DC converters 60A, 60B includes an input capacitor C2 connected between the input and the grounded terminals. The input terminal of each of the DC/DC converters 60A, 60B is connected to the common input terminal 61A, and the grounded terminal of each of the DC/DC converters 60A, 60B is connected to the common grounded terminal 63A. Each of the DC/DC converters 60A, 60B operates identically with the aforementioned DC/DC converters; each of the DC/DC converters 60A, 60B receives the input voltage Vin from the common input terminal 61A and delivers the output voltages Vout1, Vout2 to each of the output terminals 62A, 62B.

Figure 12B:
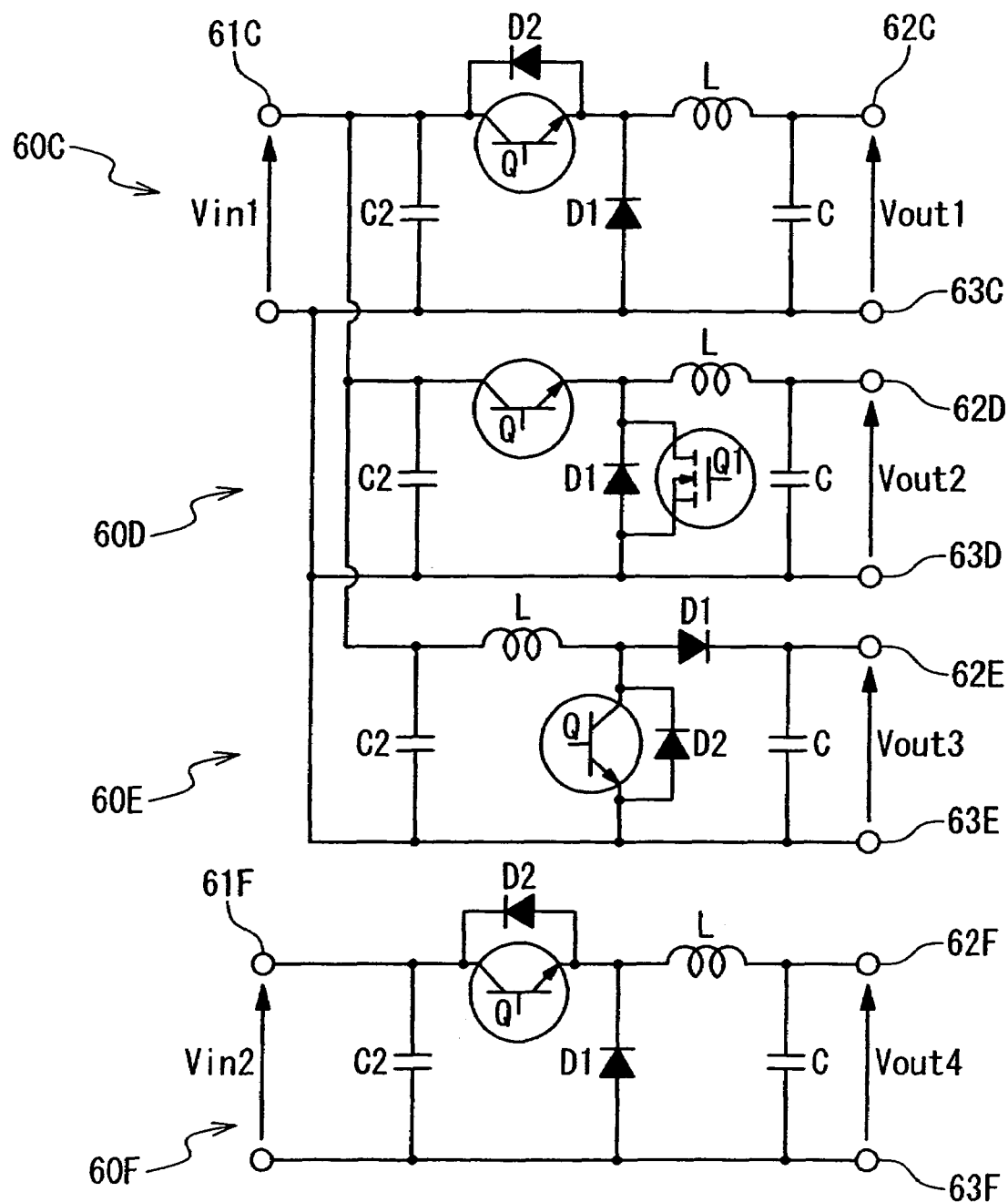

A DC power supply module may have a plurality of common input terminals 61C, 61F. The DC power supply module shown in FIG. 12B includes four DC/DC converters 60C, 60D, 60E, 60F, two common input terminals 61C, 61F, and two common grounded terminals 63C, 63F. The output terminals of the DC/DC converters 62C, 62D, 62E, 62F are used as the output terminals of the DC power supply module. Each of the DC/DC converters 60C, 60D, 60E, and 60F includes an input capacitance C2 connected between the input and the grounded terminals. The input terminal of each of the DC/DC converters is connected to either of the common input terminal 61C, 61F, and the grounded terminal of each of the DC/DC converters is connected to the grounded terminal 63C, 63F corresponding to the input terminal 61C, 61F. In FIG. 12B, the input terminal of the DC/DC converters 60C, 60D, and 60E are connected to the common input terminal 61C, and the input terminal of the DC/DC converter 60F is connected to the common input terminal 61F. The grounded terminals of the DC/DC converters 60C, 60D, and 60E are connected to the common grounded terminal 63C, and the grounded terminal of the DC/DC converter 60F is connected to the common grounded terminal 63F. Each of the DC/DC converters operates identically with the aforementioned DC/DC converters. The DC/DC converters 60C, 60D, 60E receive an input voltage Vin1 from the common input terminal 61C and delivers the output voltage Vout1, Vout2, Vout3 to the output terminals 62C, 62D, 62E, respectively. The DC/DC converter 60F receives an input voltage Vin2 from the common input terminal 61F and delivers an output voltage Vout4 to the output terminal 62F. Any of the DC/DC converters of present invention may be integrated into the aforementioned DC power supply module. The aforementioned DC power supply module enjoys the reduced volume and the suppressed power loss of the DC/DC converters of present invention.

CONCLUSION

As described above, according to the present invention, the DC/DC converter which has a reduced volume and a suppressed power loss is realized through the use of the silicon germanium bipolar transistor whose structure of the base and the collector layers are optimized.

The silicon germanium bipolar transistor has a high switching speed and the low collector-emitter on-state voltage. The high switching speed of the transistor allows a reduction in the capacitance C and the inductance L, which achieves the volume reduction of the DC/DC converter. And its advantages of low collector-emitter on-state voltage and high switching speed with short transient time at turn-on and turn-off suppresses the power loss of the DC/DC converter.

Although the invention has been described in its preferred form with a certain degree of particularity, it is understood that the present disclosure of the preferred form has been changed in the details of construction, and the combination and arrangement of parts may be resorted to without departing from the scope of the invention as hereinafter claimed.

Especially, it should be noted that it would be apparent to those skilled in the art that the DC/DC converter according to the present invention may receive an input current from a power supply in place of the input voltage Vin. This requires no substantial modification in the architecture of the DC/DC converter.

What is claimed is:

1. A DC/DC converter comprising:
  an input terminal receiving a DC power input;
  an output terminal;
  a grounded terminal;
  a smoothing capacitor connected between said output and grounded terminals; and
  a bipolar transistor having a base, an emitter and a collector, said bipolar transistor being operable to turn on and off at high speed so as to switch said DC power input received through said input terminal and generate an output DC voltage on said output terminal, wherein
  said base of said bipolar transistor includes a first silicon germanium layer and a second silicon germanium layer, said second silicon germanium layer being in contact with said emitter of said bipolar transistor,
  said first silicon germanium layer has a germanium concentration of 6 to 16%,
  said second silicon germanium layer has a germanium concentration less than that of said first silicon germanium layer,
  said base has a total thickness of 60 to 90 nm,
  said collector has a dopant concentration of $5 \times 10^{14}$ to $1 \times 10^{16}$ cm$^{-3}$,
  said bipolar transistor has a rated collector-emitter breakdown voltage of at most 50V,
  said bipolar transistor has a current gain of 300 to 500 at on-time with a collector-emitter voltage of 0.1V,
  said DC/DC converter has a switching frequency of several tens of MHz, and
  said bipolar transistor has a turn-on time and a turn-off time of at most 0.5 nsec.

2. A DC/DC converter according to claim 1, wherein said first silicon germanium layer has a germanium concentration of 8 to 13%.

3. A DC/DC converter according to claim 1, further comprising:
   an inductor connected between said emitter of said bipolar transistor and said output terminal; and
   a diode having a cathode connected to said emitter of said bipolar transistor and an anode connected to said grounded terminal,
   wherein said collector of said bipolar transistor is connected to said input terminal.

4. A DC/DC converter comprising:
   an input terminal receiving a DC power input;
   an output terminal;
   a grounded terminal;
   a smoothing capacitor connected between said output and grounded terminals; and
   a bipolar transistor having a base, an emitter and a collector, said bipolar transistor being operable to turn on and off at high speed so as to switch said DC power input received through said input terminal and generate an output DC voltage on said output terminal, wherein
   said base of said bipolar transistor includes a silicon germanium layer and a silicon layer, said silicon layer being in contact with said emitter of said bipolar transistor and said silicon germanium layer being formed between said silicon layer and said collector,
   said silicon germanium layer has a germanium concentration of 6 to 16%,
   said base has a total thickness of 60 to 90 nm,
   said collector has a dopant concentration of $5 \times 10^{14}$ to $1 \times 10^{16}$ cm$^{-3}$,
   said bipolar transistor has a rated collector-emitter breakdown voltage of at most 50V,
   said bipolar transistor has a current gain of 300 to 500 at on-time with a collector-emitter voltage of 0.1V,
   said DC/DC converter has a switching frequency of several tens of MHz, and
   said bipolar transistor has a turn-on time and a turn-off time of at most 0.5 nsec.

5. A DC/DC converter according to claim 4, wherein said silicon germanium layer has a germanium concentration of 8 to 13%.

6. A DC/DC converter according to claim 4, further comprising:
   an inductor connected between said emitter of said bipolar transistor and said output terminal; and
   a diode having a cathode connected to said emitter of said bipolar transistor and an anode connected to said grounded terminal,
   wherein said collector of said bipolar transistor is connected to said input terminal.

7. A DC/DC converter comprising:
   an input terminal receiving a DC power input;
   an output terminal;
   a grounded terminal;
   a smoothing capacitor connected between said output and grounded terminals; and
   a bipolar transistor having a base, an emitter and a collector, said bipolar transistor being operable to turn on and off at high speed so as to switch said DC power input received through said input terminal and generate an output DC voltage on said output terminal, wherein
   said base of said bipolar transistor includes a silicon germanium layer,
   said silicon germanium layer has a concentration of germanium that increases, up to 6 to 16%, as a distance from said collector decreases,
   said base has a total thickness of 60 to 90 nm,
   said collector has a dopant concentration of $5 \times 10^{14}$ to $1 \times 10^{16}$ cm$^{-3}$,
   said bipolar transistor has a rated collector-emitter breakdown voltage of at most 50V,
   said bipolar transistor has a current gain of 300 to 500 at on-time with a collector-emitter voltage of 0.1V,
   said DC/DC converter has a switching frequency of several tens of MHz, and
   said bipolar transistor has a turn-on time and a turn-off time of at most 0.5 nsec.

8. A DC/DC converter according to claim 7, wherein said silicon germanium layer has a concentration of germanium that increases, up to 8 to 13%.

9. A DC/DC converter according to claim 7, further comprising:
   an inductor connected between said emitter of said bipolar transistor and said output terminal; and
   a diode having a cathode connected to said emitter of said bipolar transistor and an anode connected to said grounded terminal,
   wherein said collector of said bipolar transistor is connected to said input terminal.

* * * * *